United States Patent
Talbert

(10) Patent No.: US 6,201,905 B1
(45) Date of Patent: Mar. 13, 2001

(54) OPTICAL SWITCH WITH CONTROLLED VOLTAGE OUTPUT

(75) Inventor: Edward J. Talbert, Wonder Lake, IL (US)

(73) Assignee: Telemotive Industrial Controls, Glendale Heights, IL (US)

( * ) Notice: Subject to any disclaimer, the term of this patent is extended or adjusted under 35 U.S.C. 154(b) by 0 days.

(21) Appl. No.: 09/245,787

(22) Filed: Feb. 5, 1999

(51) Int. Cl.$^7$ ........................................... G02B 6/35
(52) U.S. Cl. ................. 385/19; 385/16; 340/815.48; 340/815.49
(58) Field of Search .................. 385/16, 19; 340/815.48, 340/815.49, 815.5, 815.51

(56) References Cited

U.S. PATENT DOCUMENTS

| | | |
|---|---|---|
| 1,886,517 | 11/1932 | Batcheller . |
| 2,385,165 | 9/1945 | Sears . |
| 2,480,410 | 8/1949 | Hammerly . |
| 2,806,907 | 9/1957 | Mazzola . |
| 3,098,141 | 7/1963 | Wintriss . |
| 3,123,724 | 3/1964 | Schrenk et al. . |
| 3,307,006 | 2/1967 | Lawrence . |
| 3,413,430 | 11/1968 | Sharples . |
| 3,465,099 | 9/1969 | Harris . |
| 3,668,407 | 6/1972 | Matzen et al. . |
| 3,946,225 | 3/1976 | Beeck . |
| 4,079,220 | 3/1978 | Wagner et al. . |
| 4,154,997 | 5/1979 | Grebner et al. . |
| 4,206,333 | 6/1980 | Savas et al. . |
| 4,379,968 | 4/1983 | Ely et al. . |
| 4,417,824 | 11/1983 | Paterson et al. . |
| 4,429,219 | 1/1984 | Yochum et al. . |
| 4,442,425 | 4/1984 | Eibner . |
| 4,641,026 | 2/1987 | Garcia, Jr. . |
| 4,726,646 | * 2/1988 | Tanaka et al. ...................... 350/96.2 |
| 4,774,407 | 9/1988 | Erbe . |
| 4,795,900 | 1/1989 | Kokubu . |
| 4,816,671 | 3/1989 | Umemura . |
| 4,855,590 | 8/1989 | Bures et al. . |
| 4,878,729 | * 11/1989 | Stewart .............................. 350/96.18 |
| 5,045,647 | 9/1991 | Kato . |
| 5,175,780 | * 12/1992 | Sano et al. ............................. 385/47 |
| 5,272,383 | 12/1993 | Umemura et al. . |
| 5,321,311 | 6/1994 | Umemura et al. . |
| 5,345,050 | 9/1994 | Branch et al. . |
| 5,347,123 | 9/1994 | Jackson . |
| 5,930,416 | * 7/1999 | Worm et al. ........................... 385/16 |
| 5,970,201 | * 10/1999 | Anthony et al. ..................... 385/140 |

* cited by examiner

Primary Examiner—Hemang Sanghavi
Assistant Examiner—Jennifer Doan
(74) Attorney, Agent, or Firm—Gary Jarosik; Mark Galis; Michael Carrillo

(57) ABSTRACT

An optical switch of the push button type for producing a variable control signal which is proportional to the position of the push button includes a housing, having a first interior wall and a second interior wall, and a push button which extends into the interior of the housing from the exterior thereof. The push button includes a body portion disposed within the housing for movement though each of a plurality of positions, whereby changes in the position of the push button cause proportional changes in an output voltage produced by the switch. A stationary light shield is fixedly disposed within the housing between the body portion of the push button and the first interior wall of the housing, where the shield also includes a plurality of apertures. Light emitting means are disposed within the housing and between the stationary light shield and the first interior wall. Light responsive means are fixedly disposed between the stationary light shield and the body portion of the push button. A shutter, including a plurality of apertures, is associated with the body portion of the push button and is responsive to movement of the body portion of the push button. Moreover, movement of the shutter causes a proportional change in the amount of light received by the light responsive means. Thus, the control signal/output of the optical switch varies proportionately to the positioning of the push button.

17 Claims, 6 Drawing Sheets

OPTICAL SWITCH WITH CONTROLLED VOLTAGE OUTPUT

The present invention relates generally to switches and, more particularly, to switches for controlling the speed and direction of movement, and other operations of motor driven hoist cranes and the like. More specifically, the invention concerns switches of the push button type wherein each push button may be manually depressed to each of a plurality of positions in order to thereby produce a variable control signal, which is proportional to the positioning of the push button, for operations such as, for example, the speed of movement of a hoist crane in the vertical direction. In particular, the invention pertains to improvements in so-called non-contact optical switches of the above class.

Examples of non-contact optical switches of the foregoing class of switches are disclosed in U.S. Pat. Nos. 5,321,311; 5,272,383; and 4,816,671. Typically, a plurality of these switches are incorporated in a switch panel with each switch comprising a separate module, each module housing a pair of push button mechanisms and associated electronics.

Heretofore, non-contact optical switches, including those disclosed in the above-referenced patents, have been complex structures incorporating numerous parts and involved circuitry. For example, the switches disclosed in the above patents depend on electronics incorporating discrimination capability to prevent erroneous output signals such as would occur, for example, if the operator depressed both push buttons simultaneously.

Additionally, non-contact optical switches presently utilize digital output codes to control the speed of motors for equipment such as overhead cranes. These switches use light transfer through a plurality of apertures to create a finite group of output codes capable of controlling a set of motor functions. For example, the first output code would cause the motor to decelerate, the second output code would hold the current motor speed, and the third output code would cause the motor to accelerate. Therefore, various motor speeds can be achieved by accelerating and decelerating the motor to the desired speed and then holding that speed. The problem with these switches is that it is time consuming and sometimes difficult to achieve desired motor speeds.

An object of the present invention is to provide a switch module of the foregoing type having a much simplified, and consequently much less expensive, construction and mode of operation.

SUMMARY OF THE INVENTION

In accordance with one aspect of the invention, an optical switch of the push button type for producing a variable control signal which is proportional to the position of the push button includes a housing, having a first interior wall and a second interior wall, and a push button which extends into the interior of the housing from the exterior thereof. The push button includes a body portion disposed within the housing for movement through each of a plurality of positions, whereby changes in the position of the push button cause proportional changes in an output voltage produced by the switch. A stationary light shield, which includes a plurality of apertures, is fixedly disposed within the housing between the body portion of the push button and the first interior wall of the housing. Light emitting means are disposed within the housing and between the stationary light shield and the first interior wall. Light responsive means are fixedly disposed between the stationary light shield and the body portion of the push button. The light emitting means and the light responsive means are each in optical alignment with the apertures of the stationary light shield. A shutter is associated with the body portion of the push button and is responsive to movement of the body portion of the push button. The shutter also includes a plurality of apertures which allow the shutter to adjust the amount of light permitted to pass through the shield apertures.

In a preferred embodiment the light responsive means comprise an array of photo diodes and photo transistors.

In accordance with another aspect of the invention, an optical switch incorporates a switch module. Two push buttons extend into the interior of the switch module housing from the exterior thereof. Each button has a body portion disposed within the housing for movement through each of a plurality of positions. Stationary light shields are fixedly disposed in spaced apart relation within the housing, each of the shields having a plurality of apertures. First and second light emitting means are fixedly disposed within the housing between the shields, the first of the light emitting means being in optical alignment with the apertures of one of the shields, and the second of the light emitting means being in optical alignment with the apertures of an other of the shields. First and second light responsive means are fixedly disposed in spaced apart relation within the housing with the shields and the first and second light emitting means being disposed therebetween, with the first of the light responsive means being in optical alignment with the apertures of one of the shields, and the second of the light responsive means being in optical alignment with the apertures of another of the shields. First and second shutters are disposed within the housing with each of said shutters having a plurality of apertures. The first shutter is associated with the body portion of one of the push buttons and is responsive to movement thereof which thereby adjusts the amount of light permitted to pass through the apertures of one of the shields. The second shutter is associated with the body portion of the other of the push buttons and is responsive to movement thereof which thereby adjusts the amount of light permitted to pass through the apertures of another of the shields. Depending on the position of the push button and its shutter, varying amounts of light pass through to the light responsive means. Based on the amount of light received by the light responsive means, the control signals are increased or decreased proportionally. The amount of light which passes through the shields is increased proportionally by providing at least one aperture with a varying area. The size of this aperture is a product of a stationary shield aperture, which does not vary, and a correlating shutter aperture which varies in size. Moreover, the size of the shutter aperture changes as the push button is moved up or down because the shutter aperture, which extends vertically and which is comprised of varying horizontal widths, sweeps across the stationary shield aperture which is constant. Thus, as the shutter is adjusted in relation to the stationary light shields, the size of and the amount of light which passes through the aperture formed by the shutter aperture and the shield aperture is also changed.

In addition, an intensity control feedback circuit is provided to ensure that the photo diode voltage which determines the LED intensity always matches the reference voltage, regardless of any malfunctions such as LED output degradation versus time, LED output degradation versus temperature, and aperture misalignments.

Also, a safety control circuit is provided which prevents malfunctions due to depression of multiple push buttons. Specifically, if one push button is depressed, the other push button is disabled, and if both push buttons are depressed, both push buttons are disabled.

In a preferred form each of the light responsive means comprise a plurality of photo diodes and photo transistors and each of the light emitting means comprise a plurality of light emitting diodes. The output of the photo transistors determines the overall functionality of the switch.

The features of the present invention are discussed in more detail below, and it is not intended that the summary presented hereinabove should in any way limit the nature or scope of the invention disclosed and claimed herein.

DESCRIPTION OF THE DRAWINGS

The invention is further described with reference to the accompanying drawings, where like numbers refer to like parts in several views.

These drawing figures are provided for illustrative purposes only and are not drawn to scale, nor should they be construed to limit the intended scope and purpose of the present invention.

DETAILED DESCRIPTION

Figure 1:
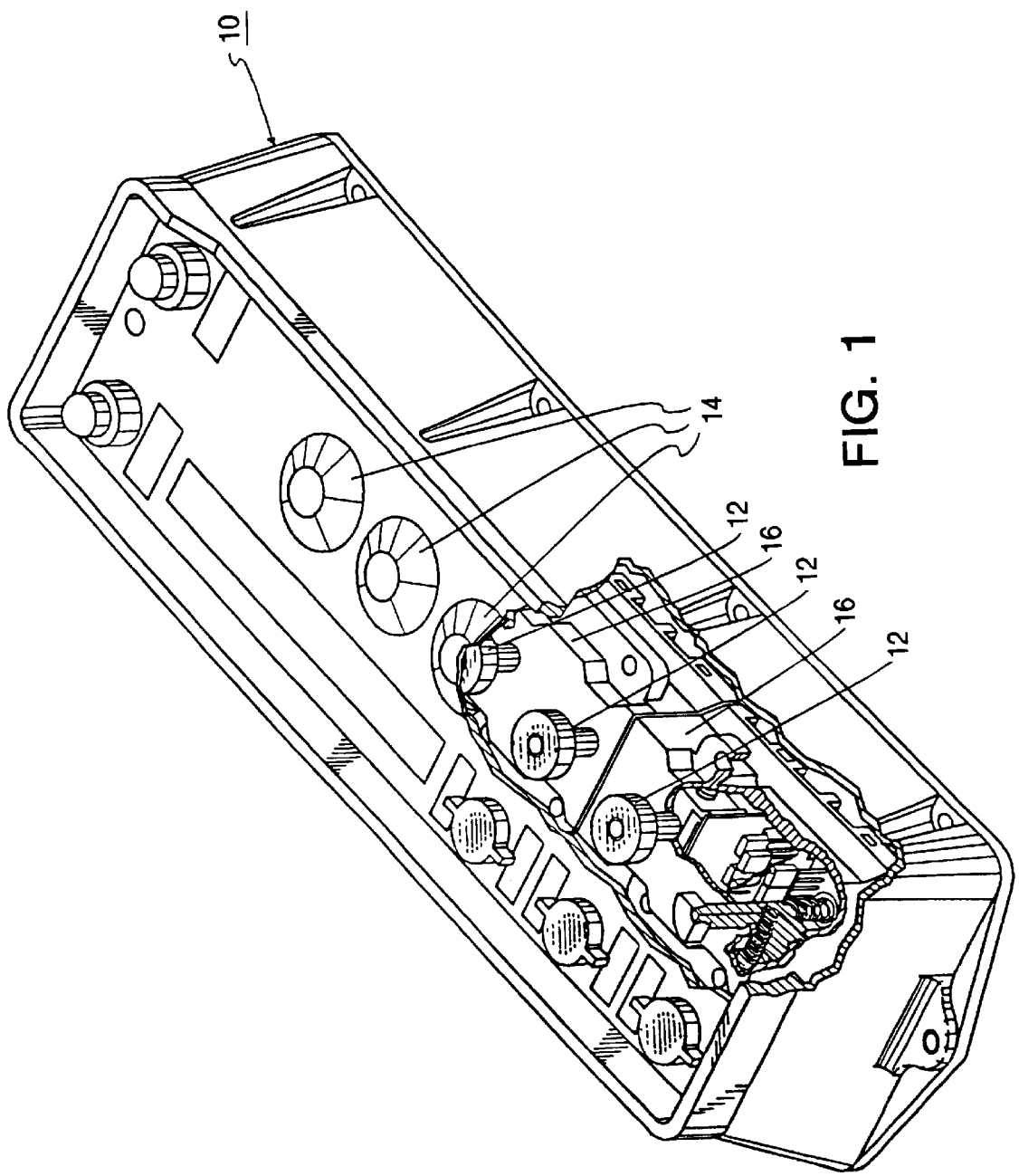
FIG. 1 is a perspective view, partially broken away, of a control panel incorporating non-contact optical switches in accordance with the present invention.

With reference to FIG. 1 there is shown for purposes of illustrative disclosure a typical control panel 10 for controlling the operation of, for example, a hoist crane. Such hoist cranes are driven by control motors for variable speed movement along each of X-Y-Z coordinates. As is typical, control panel 10 is actuated by manually depressing selected push buttons 12, which are covered by flexible covers 14, to various depressed positions. One push button, for example, is provided to control vertical movement in the upward direction. As such push button is depressed, the speed of such upward movement is variably increased in proportion to the positioning of the push button. Individual or pairs of push buttons 12 may be incorporated in each of the non-contact optical switch modules 16 as is conventional. As is well known for optical switch modules which include two push buttons or more, it is necessary to prevent conflicting control signals from being generated if more than one push button of a single module 16 are simultaneously depressed. Although the present invention can be embodied in a single push button optical switch or a multiple push button optical switch, for exemplary purposes, only optical switches with two push buttons will be discussed below.

Figure 9:
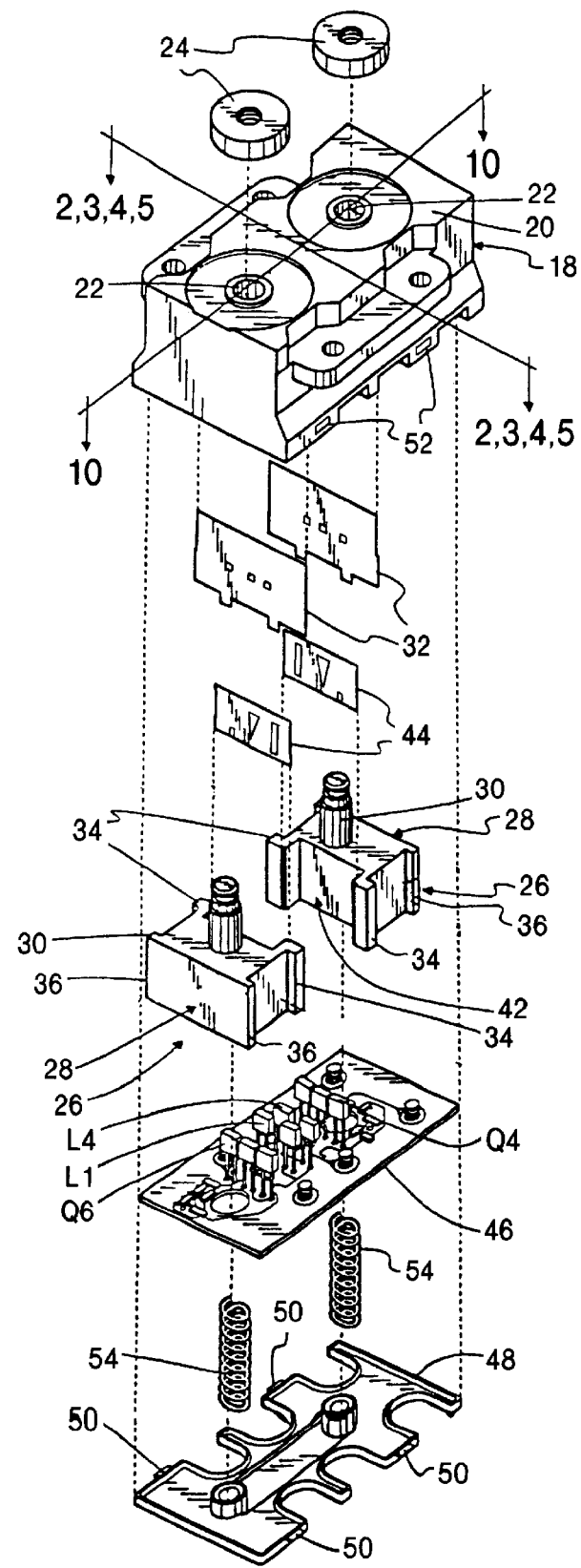
FIG. 9 is an exploded perspective view of a switch in accordance with the invention.
Figure 10:
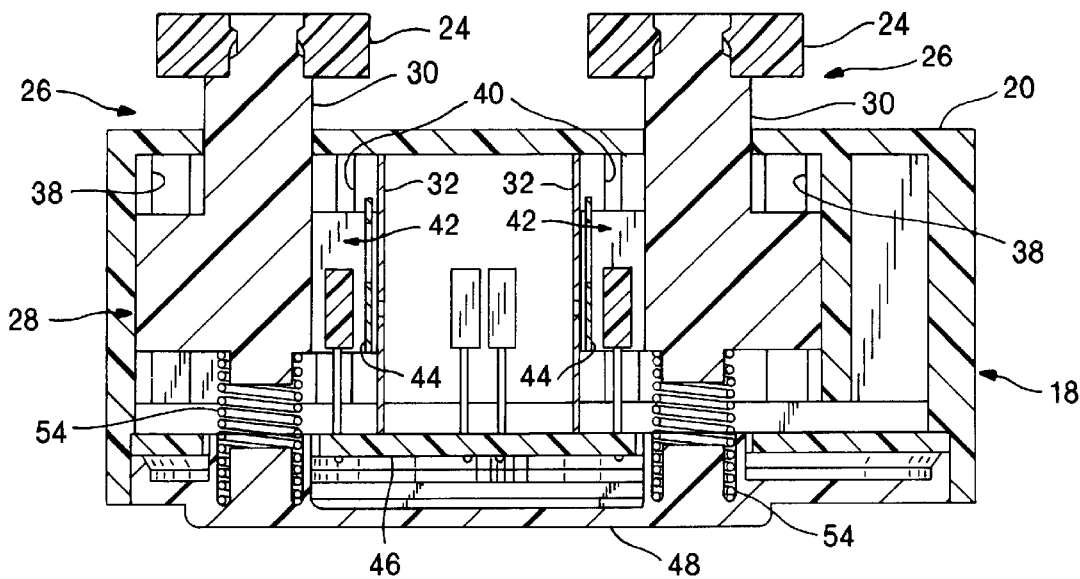
FIG. 10 is a cross sectional view taken, as indicated, along the line 10—10 of FIG. 9 of a switch module in assembled form in accordance with the invention.

With reference to FIGS. 9 and 10 the components of a non-contact optical switch in accordance with the presently preferred embodiment of the invention are shown to comprise a housing 18 having an upper wall 20 that includes a pair of journal openings 22. Two push buttons 26 each have a block-like body portion 28 and an integral shaft position 30. As will be described, each body portion 28 is disposed within housing 18 for reciprocal movement therein along a linear travel path. Each shaft portion 30 extends through one of the journal openings 22 from the interior of the housing 18 to the exterior thereof. Each shaft portion 30 has a free end to which a cap 24 is snap fit.

Each body portion 28 of the push buttons 26 includes a plurality of corner ribs or tongues 34, 36 (see FIG. 9) which are received in guideways 38, 40 (see FIG. 10) in the form of linearly extending grooves provided in each of the opposed interior side walls of the module housing 18 so that each body 28 is reciprocally and slidably received therein for travel along a linear travel path.

Figure 7:
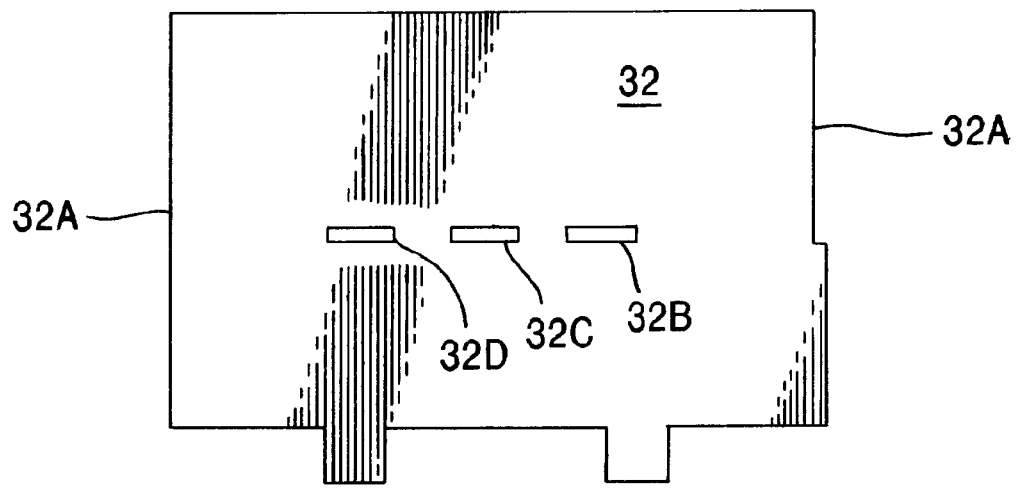
FIG. 7 is an elevational view of a stationary light shield.

A pair of stationary light shields 32, each in the form of a thin metallic plate, are disposed in fixed, spaced apart relation within housing 18. The opposed side edge portions 32A (see FIG. 7) of each shield 32 are received in mounting slots provided in the opposed interior side walls of the housing 18 so that each shield 32 completely spans the housing interior from side to side.

Figure 6:
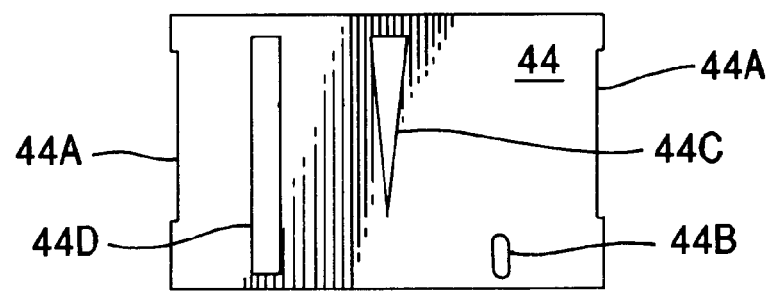
FIG. 6 is an elevational view of a shutter plate.
Figure 11:
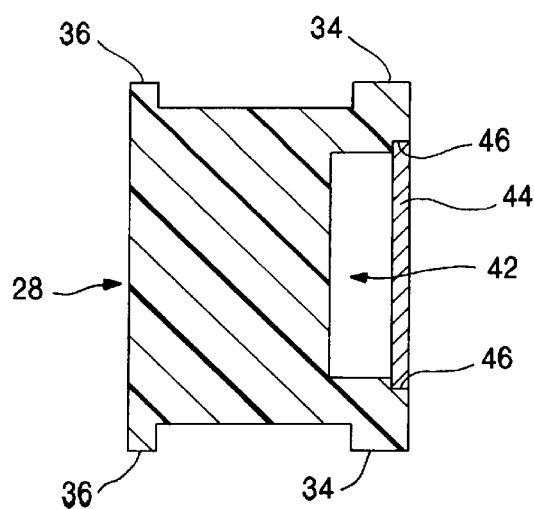
FIG. 11 is an enlarged fragmentary view of the body portion of a push button.

With reference to FIG. 11, each body portion 28 of the push buttons 12 includes a recessed section 42 and carries a shutter 44 in the form of a thin metallic plate. Each shutter 44 has side edges 44A (see FIG. 6) which are snugly fitted into grooves 46 of a body portion 28 so that the recessed section 42 together with its associated shutter 44 form a slot.

Figure 8:
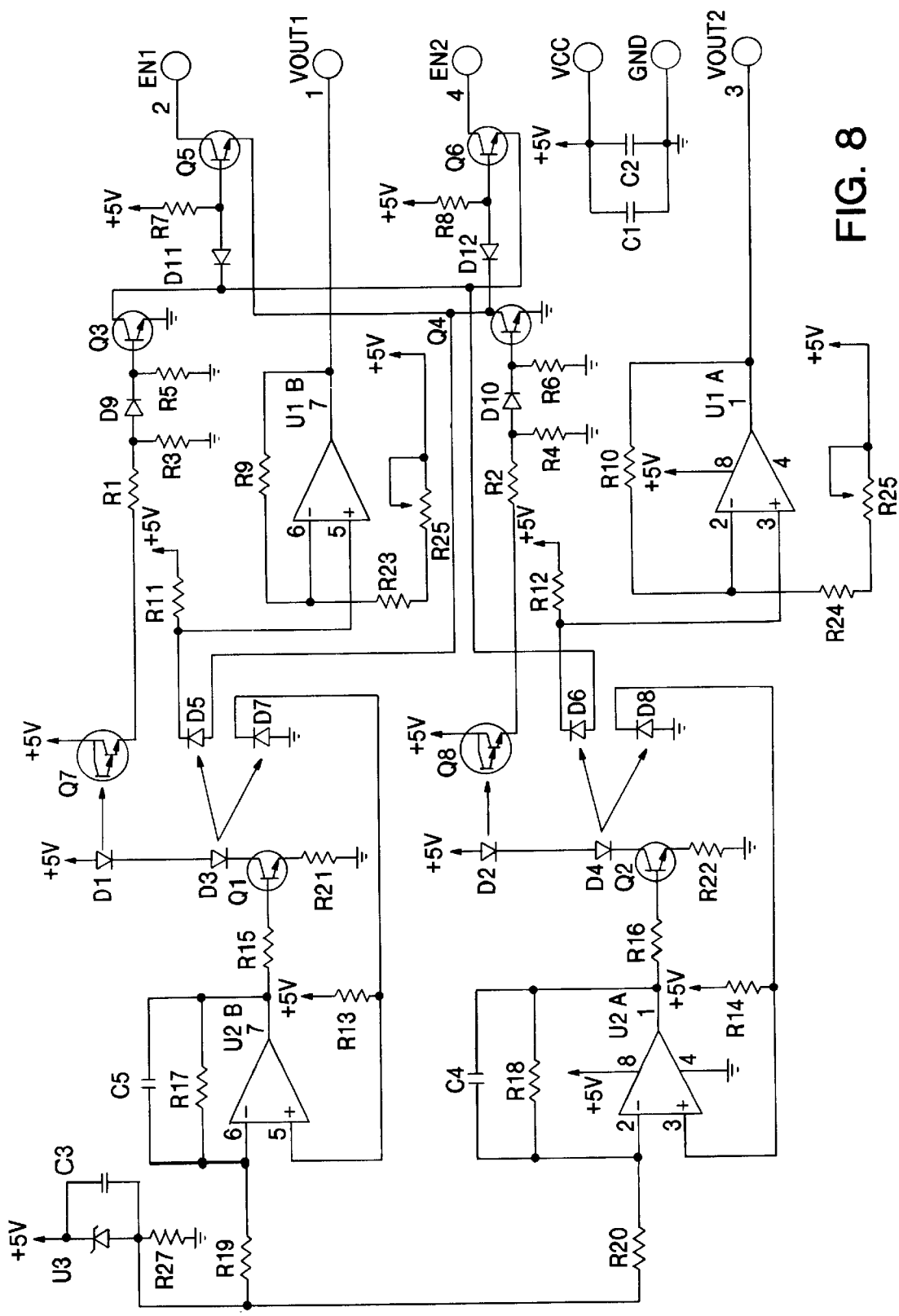
FIG. 8 is a circuit diagram of the electronics incorporated in a switch in accordance with the invention.

As exemplified in FIG. 9, the electronic components of FIG. 8 are mounted on a circuit board 46 in conventional fashion. A bottom cover 48 is provided with tabs 50 for snap fit reception in slots 52 of the housing 18.

The two push buttons 26 are biased upwardly by springs 54 and a tactile feel is given to the push buttons. Hence, as a push button is depressed by the operator, opposing force is provided by the spring 54.

Figures 2, 3:
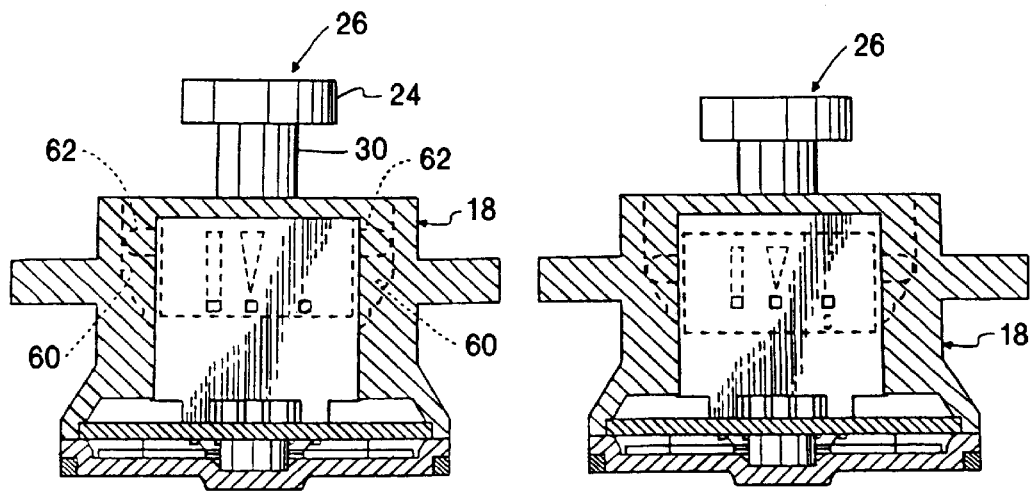
FIGS. 2 through 5 are sectional views of a switch module taken, as indicated, along the line 2, 3, 4, 5—2, 3, 4, 5, of FIG. 9 with the module being assembled and with one of the is push buttons in each of a plurality of positions.
Figures 4, 5:
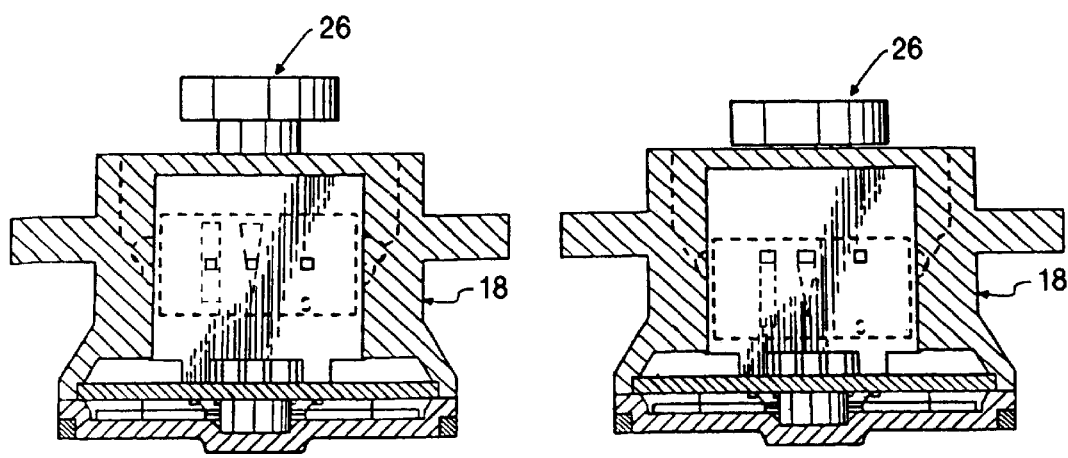

Although there are unlimited push button positions, FIGS. 2–5 illustrate four of the varying push buttons positions that exemplify the operation of the push buttons 26. In FIG. 2 a push button 26 is shown in its fully extended position. In FIG. 3 the push button 26 has been depressed to a second operative position. In FIG. 4 the push button 26 has been depressed to a third operative position. In FIG. 5 the button 26 has been fully depressed to a fourth operative position.

As best shown in FIGS. 8–10, each switch module 16 incorporates four light emitting diodes D1–D4, two for each push button 26, four light responsive photo diodes D5–D8 and two light responsive transistors Q7 and Q8 (collectively "light responsive elements"), two photo diodes and one photo transistor for each push button 26. The light emitting diodes D1–D4 are located between the shields 32. Two of the light responsive photo diodes, D5, D7 and one photo transistor Q7, are disposed in the recessed section 42 of one of the body portions 28 with the remaining three light responsive elements being disposed in the recessed section 42 of the other body portion 28 as best shown in FIG. 10.

In FIG. 8 there are four output terminals denoted 1, 2, 3 and 4. As will be explained more fully hereinbelow, with the illustrated arrangement, one of the push buttons can cause output signals to be produced at terminals 1 and 2 only, or at terminals 3 and 4 only.

Each shield 32 has a plurality of openings 32B, 32C and 32D. Each shutter 44 has a plurality of elongated openings 44B, 44C and 44D. When a push button 26 is in its fully extended position (see FIG. 2) shutter openings 44B and 44D are aligned with shield openings 32B and 32D, respectively. However, shutter opening 44C is not aligned with shield opening 32C. When both push buttons of a module 18 are at the position shown in FIG. 2, light from emitting diodes D1 and D3 (see FIG. 8) passes through the shield and shutter to light responsive photo transistor Q7 and light responsive photo diode D7 respectively. However, no light is transmitted to photo diode D5. When either of the two push buttons 26 of module 18 is depressed slightly, shutter opening 44B of its associated shutter 44 becomes optically misaligned with shield opening 32B. Thus, for example, if light responsive transistor Q7 fails to receive light from emitting diode D1 due to misalignment of its associated shutter opening 44B and shield opening 32B (as shown in FIG. 3), then the other push button will be unable to produce any output signals for terminals 3 and 4. This is the safety operation which doesn't allow both push buttons to operate simultaneously.

FIG. 8 discloses the circuit diagram for the two push buttons 12. These circuits also include two LED drive circuits. The LED drive circuit is designed to provide a constant current source along with a feedback control for the optical switch. Specifically, each of the push buttons 12 are designed to allow light to pass through shutter opening 44D and shield opening 32D at all times. This light source serves as a reference light source for the LED drive circuit. For example, the light that passes through shutter opening 44D and shield opening 32D to photo diode D7 causes photo diode D7 to produce a current in the photo diode which is proportional to the intensity of the light which passes to photo diode D7. This, in turn, produces a voltage drop across resistor R13 which is directed to the positive input of op-amp U2B. The negative input for op-amp U2B is provided by zener diode U3. The op-amp U2B has a low gain to reduce oscillation. The voltage drop across zener diode U3 is provided as a "reference voltage" for the LED drive circuit. The output from the op-amp U3 acts as the control signal for transistor Q1. Therefore, the intensity of LED D3 is directly controlled by the feedback loop discussed above. More particularly, as the light intensity increases, the voltage at the positive input of op-amp U2B decreases. When this voltage drops below the reference voltage, the output voltage from the op-amp decreases thereby reducing the current provided to the LED D3 and the light intensity provided by the photo diode D3. Thus, the light intensity for photo diode D7 will be adjusted until the voltage at the positive input of op-amp U2B is equal to the reference voltage.

The light intensity can be effected by the position of or mechanical misalignment of the apertures provided on shield 32 or shutter 44. If these apertures are not aligned properly, the amount of light which passes through to photo diodes D5 and D7 will decrease. Since the apertures are all located on either shield 32 or shutter 44, any decrease in light intensity due to position or mechanical misalignment should be consistent among all apertures. Hence, the LED drive circuit will keep the light intensity levels received by photo diodes D5 and D7 constant resulting in a stable circuit with a repeatable light source.

In FIG. 3 the shutter opening 44D has become aligned with shield opening 32D and shutter opening 44C has become aligned with shield opening 32C. With push button 26 in this position, assuming such push button is associated with LED's D1 and D3, responsive photo diode D5 will produce an output at terminal 1. Further, depression of the same push button will result in a decreased output at terminal 1 in proportion to the position of the push button.

As will be exemplified in FIG. 8, if the push button 26, associated with LED's D2 and D4, were to be depressed, terminals 1 and 2 would be disabled. Thus, depression of one of the two push buttons 26 disables the other. If both are depressed, both are disabled. Depressing none, enables all.

In the specific embodiment illustrated herein the circuit elements shown in FIG. 8 are as follows:

| Circuit Element | Description |
| --- | --- |
| D1 | LED, T1 ¾ |
| D2 | LED, T1 ¾ |
| D3 | LED, T1 ¾ |
| D4 | LED, TI ¾ |
| D5 | PHOTO DIODE |
| D6 | PHOTO DIODE |
| D7 | PHOTO DIODE |
| D8 | PHOTO DIODE |
| D9 | DIODE |
| D10 | DIODE |
| D11 | DIODE |
| D12 | DIODE |
| U1 | OP-AMP |
| U2 | OP-AMP |
| U3 | INTEGRATED CIRCUIT |
| Q1 | TRANSISTOR |
| Q2 | TRANSISTOR |
| Q3 | TRANSISTOR |
| Q4 | TRANSISTOR |
| Q5 | TRANSISTOR |
| Q6 | TRANSISTOR |
| Q7 | PHOTO TRANSISTOR |
| Q8 | PHOTO TRANSISTOR |
| R1 | 4.7K ohms |
| R2 | 4.7K ohms |
| R3 | 22K ohms |
| R4 | 22K ohms |
| R5 | 4.7K ohms |
| R6 | 4.7K ohms |
| R7 | 10K ohms |
| R8 | 10K ohms |
| R9 | 10K ohms |
| R10 | 10K ohms |
| R11 | 220K ohms |
| R12 | 220K ohms |
| R13 | 220K ohms |
| R14 | 220K ohms |
| R15 | 4.7K ohms |
| R16 | 4.7K ohms |
| R17 | 100K ohms |
| R18 | 100K ohms |
| R19 | 10K ohms |
| R20 | 10K ohms |
| R21 | 120 ohms |
| R22 | 120 ohms |
| R23 | 3.3K ohms |
| R24 | 3.3K ohms |
| R25 | 10K ohms (POTENTIOMETER) |
| R26 | 10K ohms (POTENTIOMETER) |
| R27 | 10K ohms |
| C1 | 470 pF |
| C2 | 0.1 uF |
| C3 | 470 pF |
| C4 | 100 pF |
| C5 | 100 pF |

Although the present invention has been described with reference to preferred embodiments, workers skilled in the art will recognize that changes may be made in form and detail without departing from the spirit and scope of the invention.

What is claimed is:

1. In an optical switch of the multiple push button type for producing a plurality of control signals, the combination comprising:

a housing;

at least two sliders each disposed within said housing to move between an initial position and at least two other positions;

a pair of stationary light shields disposed between said sliders in spaced apart relation, each of said shields having a plurality of apertures;

light emitting means disposed between said stationary light shields;

separate light responsive means disposed adjacent to each of said sliders; and a pair of moveable light shields each disposed between one of said stationary light shields and one of said light responsive means, each of said moveable light shields having a plurality of apertures and each being moveable in response to movement of a separate one of said sliders, wherein said moveable light shields include at least one vertically extending aperture with varying horizontal widths and where said vertically extending aperture allows the optical switch to produce varying output voltages.

2. An optical switch in accordance with claim 1 wherein the sliders are moveable along a separate linear travel path that extends parallel to said housing and defines a plane.

3. An optical switch in accordance with claim 1 wherein said stationary light shields comprise a thin shield plate.

4. An optical switch in accordance with claim 3 wherein said moveable light shields are disposed between said sliders and adjacent to said stationary light shield and where said moveable light shields are carried by said sliders.

5. An optical switch in accordance with claim 1 wherein said optical switch further comprises an intensity control circuit which provides a constant light source to said light responsive means.

6. An optical switch in accordance with claim 1 wherein said optical switch further comprises a safety circuit whereby only a single push button can be enabled at one time.

7. An optical switch in accordance with claim 1 wherein each of said light emitting means includes at least two light emitting elements and wherein said light responsive means includes at least three light responsive elements.

8. An optical switch, comprising:

a housing;

a light source disposed within the housing;

first and second light receptors disposed within the housing;

a push button extending into the housing including a shutter having a first aperture through which light from the light source passes, the shutter being disposed between the light source and the second light receptor and moveable into a plurality of positions within the housing;

wherein the first light receptor is responsive to the light source and is used to control the intensity of the light source; and wherein the second light receptor is responsive to the light source and is used to control an output voltage generated by the optical switch whereby a change in the position of the first aperture relative to the light source and the second light receptor causes a proportional change in the generated output voltage.

9. The optical switch in accordance with claim 8 wherein the shutter has a second aperture through which light from the light source passes, the second aperture being used to control the passage of light from the light source to the first light receptor.

10. The optical switch in accordance with claim 9 further comprising a light shield fixedly positioned within the housing between the light source and the shutter, the light shield having a first aperture in optical alignment between the light source and the first light receptor and a second aperture in optical alignment between the light source and the second light receptor.

11. The optical switch in accordance with claim 8 wherein the shutter is moveable along linear path.

12. An optical switch comprising:

a housing;

a light source disposed within the housing;

first and second light receptors disposed within the housing;

first and second push buttons extending into the housing each including a shutter having a first aperture through which light from the light source passes, each shutter being disposed between the light source and a respective one of the first and second light receptors, each shutter being independently moveable into a plurality of positions within the housing;

wherein at least one of the first and second light receptors is responsive to the light source and is used to control the intensity of the light source; and wherein the first and second light receptors are responsive to the light source and are each used to control an output voltage generated by the optical switch whereby a change in the position of the first apertures relative to the light source and the corresponding first and second light receptors cause a proportional change in the generated output voltage.

13. The optical switch in accordance with claim 12 wherein each of the shields has a second aperture through which light from the light source passes, the second apertures being used to control the passage of light from the light source to the first and second light receptors, and the first and second light receptors are responsive to the position of the second apertures to prevent the generation of the output voltage.

14. The optical switch in accordance with claim 13 wherein the optical switch generates two distinct output voltages under the control of the respective first and second light receptors and wherein the first and second light receptors are responsive to the position of the second apertures to prevent the generation of the corresponding one of the two output voltages.

15. The optical switch in accordance with claim 12 wherein the first and second light receptors each comprise a plurality of light responsive elements.

16. The optical switch in accordance with claim 12 wherein the first apertures each has a width that allows varying amounts of light to pass from the light source to the respective one of the first and second light receptors as a function of the position of the respective shutter.

17. An optical switch, comprising:

a housing;

a light source disposed within the housing;

a light receptor disposed within the housing;

a push button extending into the housing including a shutter, the shutter being disposed between the light source and the receptor and moveable into a plurality of positions within the housing, the shutter having an aperture which allows varying amounts of light to pass from the light source to the light receptor as a function of the position of the shutter relative to the light receptor; and wherein the light receptor is responsive to the light source and is used to control an output voltage generated by the optical switch whereby a change in the position of the aperture relative to the light source and the light receptor causes a proportional change in the generated output voltage.

* * * * *